United States Patent
Kono et al.

(10) Patent No.: US 6,894,940 B2
(45) Date of Patent: May 17, 2005

(54) SEMICONDUCTOR MEMORY DEVICE HAVING A SUB-AMPLIFIER CONFIGURATION

(75) Inventors: Takashi Kono, Hyogo (JP); Takeshi Hamamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/625,588

(22) Filed: Jul. 24, 2003

(65) Prior Publication Data

US 2004/0145956 A1 Jul. 29, 2004

(30) Foreign Application Priority Data

Jan. 28, 2003 (JP) .................................... 2003-018366

(51) Int. Cl.[7] .............................................. G11C 7/00
(52) U.S. Cl. ................... 365/205; 365/230.06
(58) Field of Search ......................... 365/205, 230.06

(56) References Cited

U.S. PATENT DOCUMENTS 5,596,521 A * 1/1997 Tanaka et al. ............... 365/49
5,604,697 A * 2/1997 Takahashi et al. .......... 365/182
6,147,925 A * 11/2000 Tomishima et al. ..... 365/230.03

FOREIGN PATENT DOCUMENTS

JP 6-187782 7/1994

OTHER PUBLICATIONS

Sakata, et al. "A DDR/SDR–Compatible SDRAM Design with a Three–Size Flexible Column Redundancy" Symposium on VLSI Circuits Digest of Technical Papers (2000) pp. 116–119.

* cited by examiner

Primary Examiner—M. Tran
(74) Attorney, Agent, or Firm—McDermott Will & Emery LLP (57) ABSTRACT

A sense amplifier driving line is connected to the source of an N-channel MOS transistor. Accordingly, even if a control signal attains H level, a sub-amplifier will not operate. This is because the sense amplifier driving line and an LIO line pair both attain a precharge potential, and a gate-source voltage of an N-channel MOS transistor attains 0V. Thus, it is not necessary to add a circuit configuration for supplying a signal notifying of activation of a row block, and a semiconductor memory device with a smaller area is obtained.

7 Claims, 9 Drawing Sheets

SEMICONDUCTOR MEMORY DEVICE HAVING A SUB-AMPLIFIER CONFIGURATION

BACKGROUND OF THE INVENTION

1. Field of the Invention

The present invention relates to a semiconductor memory device, and more particularly to a semiconductor memory device such as a DRAM (Dynamic Random Access Memory) having a sub-amplifier configuration.

2. Description of the Background Art

A conventional semiconductor memory device disclosed in FIG. 10 of Japanese Patent Laying-Open No. 6-187782 includes a plurality of memory cell arrays, and an auxiliary read amplifier provided for each of the plurality of sense amplifiers in each memory cell array, and connected to each sense amplifier and a pair of sub-input/output line. The source of a transistor within the auxiliary read amplifier is connected to the source of a transistor in each sense amplifier.

The conventional semiconductor memory device with such a configuration, however, requires a precharge circuit for equalizing the sub-input/output line to the source voltage of the transistor within the sense amplifier. Accordingly, the conventional semiconductor memory device requires an extra circuit area for the precharge circuit. Consequently, the circuit area for the entire semiconductor memory device increases.

SUMMARY OF THE INVENTION

Accordingly, an object of the present invention is to provide a semiconductor memory device implementing a smaller area.

A semiconductor memory device according to the present invention includes: a plurality of memory cells arranged in a matrix of rows and columns; a plurality of word lines arranged corresponding to a plurality of rows in the plurality of memory cells; a plurality of bit line pairs arranged corresponding to a plurality of columns in the plurality of memory cells; a plurality of sense amplifier zones detecting and amplifying data read from the plurality of memory cells; and a plurality of sub-word line driver zones intersecting each of the plurality of sense amplifier zones. Each of the plurality of sense amplifier zones includes a plurality of sense amplifiers provided corresponding to the plurality of bit line pairs and detecting and amplifying a potential difference between the corresponding bit line pair, a sense amplifier driving line provided in common to the plurality of sense amplifiers, and a plurality of first data line pairs provided corresponding to the plurality of bit line pairs and each selectively connected to a corresponding bit line. The semiconductor memory device further includes a plurality of sub-amplifiers corresponding to each of the plurality of first data line pairs and each provided in a region where the plurality of sense amplifier zones cross the plurality of sub-word line driver zones. Each of the plurality of sub-amplifiers includes first, second, and third transistors. The first transistor has a control terminal connected to one line of the first data line pair, a first conductive terminal connected to the other line of the first data line pair, and a second conductive terminal connected to a first conductive terminal of the third transistor. The second transistor has a control terminal connected to the other line of the first data line pair, a first conductive terminal connected to one line of the first data line pair, and a second conductive terminal connected to the first conductive terminal of the third transistor. The third transistor has a control terminal receiving an activation timing control signal for the sub-amplifier, and a second conductive terminal connected to the sense amplifier driving line.

A semiconductor memory device according to another aspect of the present invention includes: a plurality of memory cells arranged in a matrix of rows and columns; a plurality of word lines arranged corresponding to a plurality of rows in the plurality of memory cells; a plurality of bit line pairs arranged corresponding to a plurality of columns in the plurality of memory cells; a plurality of sense amplifier zones detecting and amplifying data read from the plurality of memory cells; and a plurality of sub-word line driver zones intersecting each of the plurality of sense amplifier zones. Each of the plurality of sense amplifier zones includes a plurality of sense amplifiers provided corresponding to the plurality of bit line pairs and detecting and amplifying a potential difference between the corresponding bit line pair, a sense amplifier driving line provided in common to the plurality of sense amplifiers, and a plurality of first data line pairs provided corresponding to the plurality of bit line pairs and each selectively connected to a corresponding bit line. Each of the plurality of sub-word line driver zones includes a plurality of second data line pairs provided corresponding to the plurality of first data line pairs and receiving data amplified via the sub-amplifier of corresponding first data line pair in reading. The semiconductor memory device further includes a plurality of sub-amplifiers provided corresponding to each of the plurality of first data line pairs and each provided in a region where the plurality of sense amplifier zones cross the plurality of sub-word line driver zones. Each of the plurality of sub-amplifiers includes first, second, and third transistors. The first transistor has a control terminal connected to one line of the first data line pair, a first conductive terminal connected to one line of the second data line pair, and a second conductive terminal connected to a first conductive terminal of the third transistor. The second transistor has a control terminal connected to the other line of the first data line pair, a first conductive terminal connected to the other line of the second data line pair, and a second conductive terminal connected to the first conductive terminal of the third transistor. The third transistor has a control terminal receiving an activation timing control signal for the sub-amplifier, and a second conductive terminal connected to the sense amplifier driving line.

According to the present invention, a semiconductor memory device with smaller area can be implemented, and amplitude of data read via a data line to a read/write control circuit can be prevented from being lowered.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described in detail with reference to the figures. It is noted that the same reference characters refer to the same or corresponding components in the figures, and description therefor will not be repeated.

Figure 1:
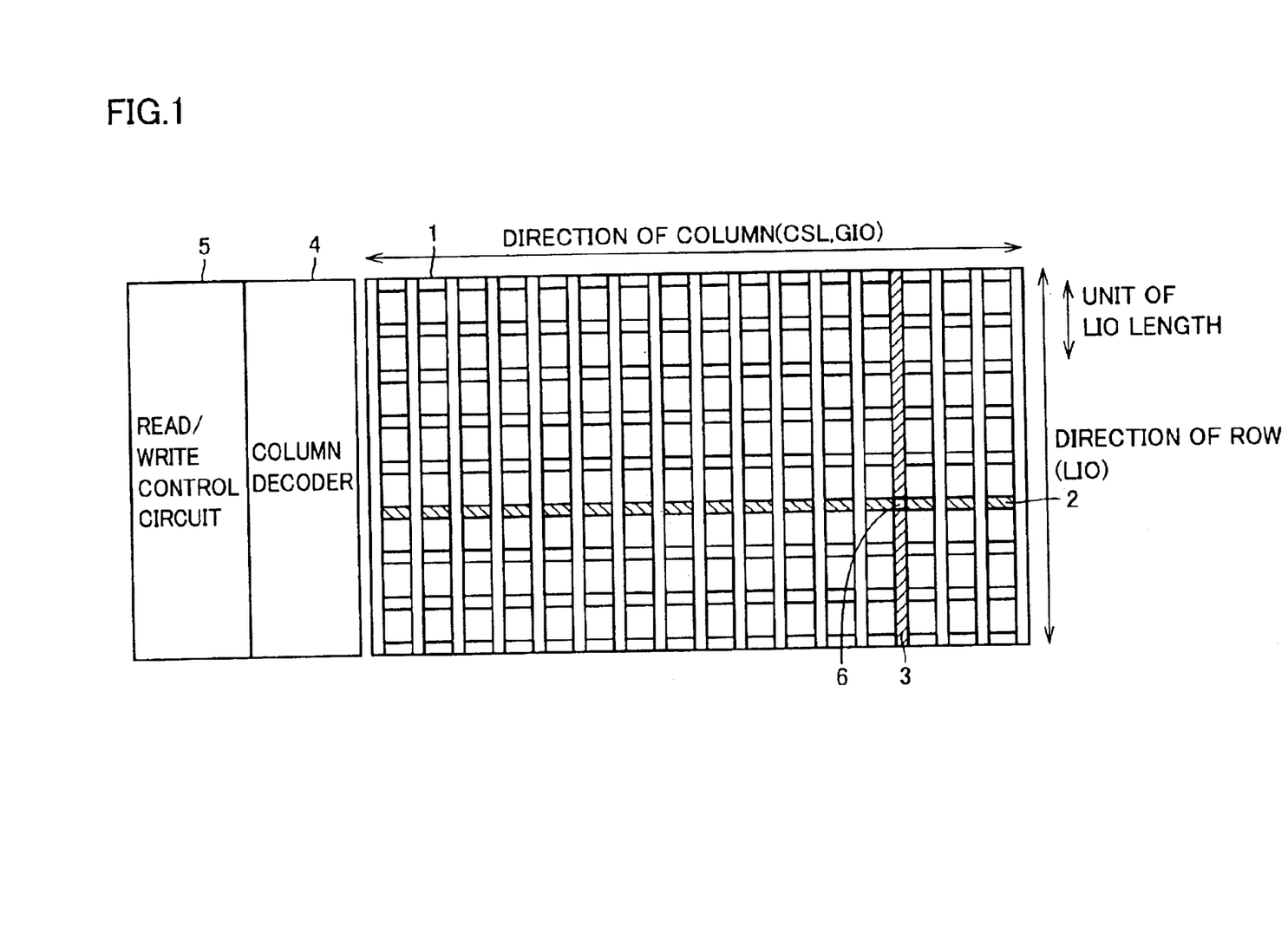
FIG. 1 schematically shows a main portion of a DRAM in an embodiment of the present invention.

A DRAM in the embodiments of the present invention shown in FIG. 1 includes a base mat 1, a column decoder 4, and a read/write control circuit 5.

Base mat 1 has a hierarchical word line configuration consisting of a main word line and a sub-word line, and is sectioned in a meshed manner by a sub-word line driver zone 2 arranged in a direction of column and a sense amplifier zone 3 arranged in a direction of row. Here, sub-word line driver zone 2 and sense amplifier zone 3 shown with hatching in FIG. 1 indicate exemplary one of a plurality of driver zones and sense amplifier zones respectively. In addition, in base mat 1, an input/output line communicating data with the outside is also assumed to employ a hierarchical input/output line configuration.

Column decoder 4 selects a column selection line CSL running in a direction of sub-word line driver zone 2, in accordance with a column address externally input in reading/writing. Read/write control circuit 5 controls a read/write operation through a hierarchical input/output line (described later) within the memory cell array with respect to a sense amplifier within sense amplifier zone 3 selected by column selection line CSL. A part of specific circuit configuration of column decoder 4 and read/write control circuit 5 will be described later.

A first input/output line pair within the memory cell array connected to the sense amplifier within sense amplifier zone 3 when column selection line CSL is activated is referred to as an "LIO line pair." The LIO line pair corresponds to the sub-input/output line in Japanese Patent Laying-Open No. 6-187782, and runs 2 blocks within sense amplifier zone 3. Here, sense amplifier zone 3 is divided into 8 portions in the direction of row in FIG. 1, which means that sense amplifier zone 3 is divided into 4 column blocks.

In a higher hierarchy level in the LIO line pair, a second input/output line pair within the memory cell array extending from read/write control circuit 5 to an opposite end of base mat 1 is referred to as a "GIO line pair". The GIO line pair runs on sub-word line driver zone 2, and is arranged so as not to cause region conflict with column selection line CSL running in the same direction. The LIO line pair and the GIO line pair are collectively called "hierarchical input/output line."

One GIO line pair is selectively connected, for example, to half the number of LIO line pairs within sense amplifier zone 3 of base mat 1. Here, the phrase "selectively connected" means that only the LIO line pair included in sense amplifier zone 3 corresponding to an activated row block is connected to the GIO line pair. In other words, a signal indicating an activated row block is relevant to connection between the GIO line pair and the LIO line pair.

As described above, the GIO line pair runs on sub-word line driver zone 2, while the LIO line pair runs in sense amplifier zone 3. Therefore, physical connection therebetween is achieved in a crossing zone 6, which is a region where sub-word line driver zone 2 intersects sense amplifier zone 3. Crossing zone 6 shown in FIG. 1 illustrates one example out of a plurality of crossing zones. A circuit configuration of crossing zone 6 and a periphery thereof according to the present invention will be described for each embodiment in the following.

(First Embodiment)

Figure 2:
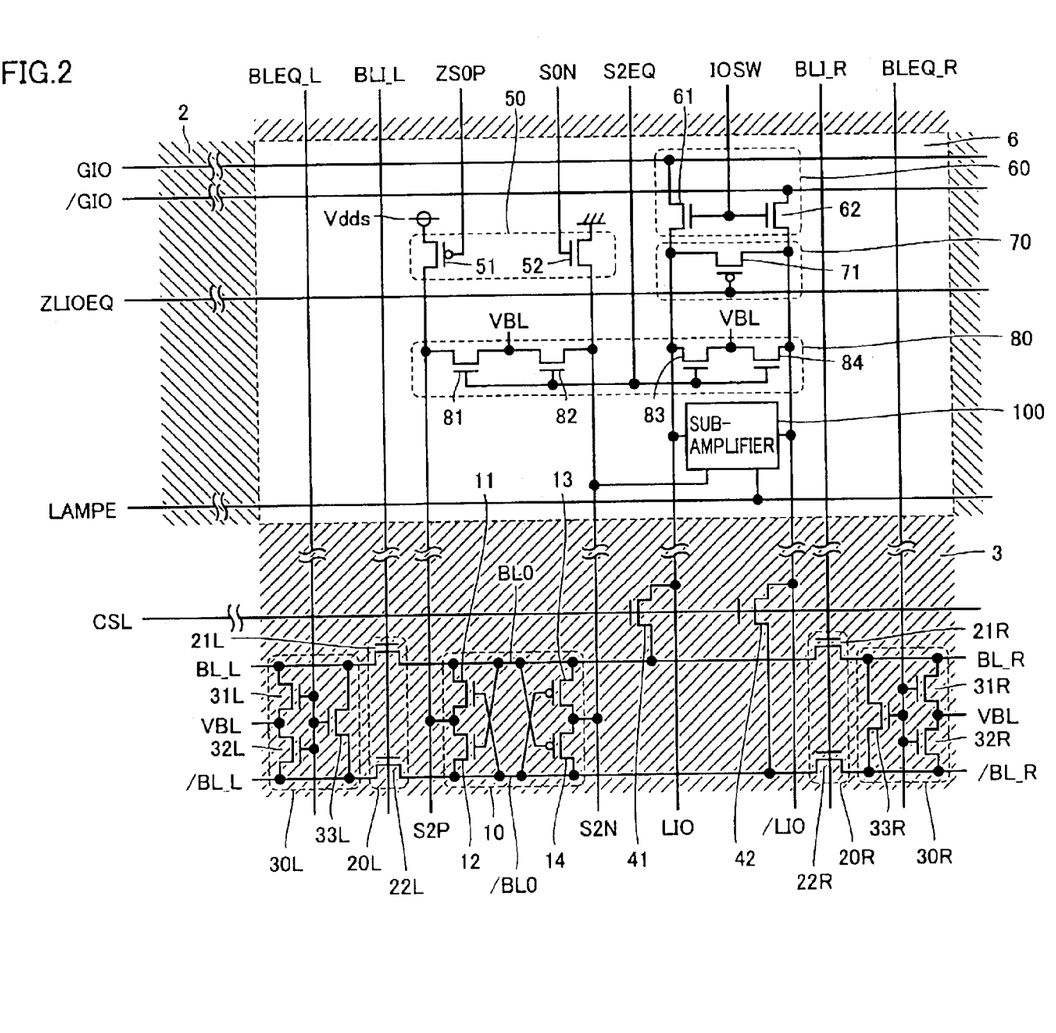
FIG. 2 is a circuit diagram showing a circuit configuration of a crossing zone 6 and a periphery thereof in a first embodiment.

FIG. 2 is a circuit diagram showing a circuit configuration of crossing zone 6 and the periphery thereof in a first embodiment.

As shown in FIG. 2, sense amplifier zone 3 in a peripheral circuit includes a sense amplifier 10, bit line isolation control circuits 20L, 20R, bit line equalizers 30L, 30R, and N-channel MOS transistors 41, 42. Crossing zone 6 includes a sense amplifier activation circuit 50, an input/output switching circuit 60, an LIO line equalizer 70, a VBL precharge circuit 80, and a sub-amplifier 100.

First, a circuit configuration within sense amplifier zone 3 will be described in detail.

Sense amplifier 10 is connected between bit line pair BL0, /BL0, and includes N-channel MOS transistors 11, 12, and P-channel MOS transistors 13, 14. Sense amplifier 10 amplifies a small potential difference read from a memory cell (not shown) on bit line pair BL0, /BL0 by a potential each provided through sense amplifier driving lines S2P, S2N.

A bit line isolation control circuit 20L includes N-channel MOS transistors 21L, 22L, and electrically connects/isolates bit line pair BL_L, /BL_L to/from bit line pair BL0, /BL0, in response to a bit line isolation signal BLI_L. A bit line isolation control circuit 20R includes N-channel MOS transistors 21R, 22R, and electrically connects/isolates bit line pair BL_R, /BL_R to/from bit line pair BL0, /BL0, in response to a bit line isolation signal BLI_R.

A bit line equalizer 30L includes N-channel MOS transistors 31L, 32L and 33L, and equalizes bit line pair BL_L, /BL_L to a precharge potential VBL, in response to a bit line equalizing signal BLEQ_L. A bit line equalizer 30R includes N-channel MOS transistors 31R, 32R and 33R, and equalizes bit line pair BL_R, /BL_R to precharge potential VBL, in response to a bit line equalizing signal BLEQ_R. Here, precharge potential VBL is set to ½ of a power supply potential Vdds. In addition, power supply potential Vdds is a data potential of H level (logic high) held in the memory cell.

N-channel MOS transistors 41, 42 electrically connect/isolate bit line pair BL0, /BL0 to/from the LIO line pair, in response to a signal from column selection line CSL.

A circuit configuration in crossing zone 6 will now be described in detail.

Sense amplifier activation circuit 50 includes a P-channel MOS transistor 51 and an N-channel MOS transistor 52, and supplies power supply potential Vdds and a ground potential GND to sense amplifier driving lines S2P, S2N respectively, in response to sense amplifier activation signals ZS0P, S0N. In further detail, sense amplifier activation circuit 50 couples sense amplifier driving lines S2P, S2N to power supply potential Vdds and ground potential GND respectively, when sense amplifier activation signals ZS0P, S0N attain L level and H level respectively after an appropriate delay since a corresponding row block is activated. Sense amplifier 10 is thus activated.

Input/output switching circuit 60 includes N-channel MOS transistors 61, 62. Input/output switching circuit 60 selectively connects the LIO line pair included in one of sense amplifier zones 3 to the corresponding GIO pair, when an input/output switching signal IOSW attains H level and a row block adjacent to one of sense amplifier zones 3 is activated.

LIO line equalizer 70 includes a P-channel MOS transistor 71, and short-circuits the LIO line and the /LIO line to equalize potentials thereof, when an LIO line equalizing signal ZLIOEQ attains L level. LIO line equalizing signal ZLIOEQ is generated, originating from a column selection enable signal CDE (not shown) determining an activation timing of column selection line CSL. While column selection enable signal CDE is at H level, LIO line equalizing signal ZLIOEQ attains H level, and LIO of the LIO line pair is electrically isolated from /LIO of the LIO line pair. In contrast, while column selection enable signal CDE is at L level, LIO line equalizing signal ZLIOEQ attains L level, and LIO of the LIO line pair is electrically connected to /LIO of the LIO line pair.

VBL precharge circuit 80 includes N-channel MOS transistors 81, 82, 83 and 84, and precharges sense amplifier driving lines S2P, S2N and the LIO line pair to precharge potential VBL, in response to a precharge activation signal S2EQ. In more detail, when a row block adjacent to one of sense amplifier zones 3 is inactive, precharge activation signal S2EQ attains H level, and sense amplifier driving lines S2P, S2N and the LIO line pair are precharged to precharge potential VBL.

In the following description, it is assumed that the precharge potential of the GIO line pair and the LIO line pair in a column operation is equal to power supply potential Vdds, for the sake of convenience of illustration. In addition, the GIO line pair is also assumed to be precharged in read/write control circuit 5 in FIG. 1.

Sub-amplifier 100 is connected between the LIO line pair, and amplifies a small potential difference between the LIO line pair, in response to control signal LAMPE. Sub-amplifier 100 corresponds to the auxiliary read amplifier in Japanese Patent Laying-Open No. 6-187782, and is provided in order to prevent the amplitude of the data read via the hierarchical input/output line to read/write control circuit 5 from being lowered. The specific circuit configuration of sub-amplifier 100 will now be described.

Figure 3:
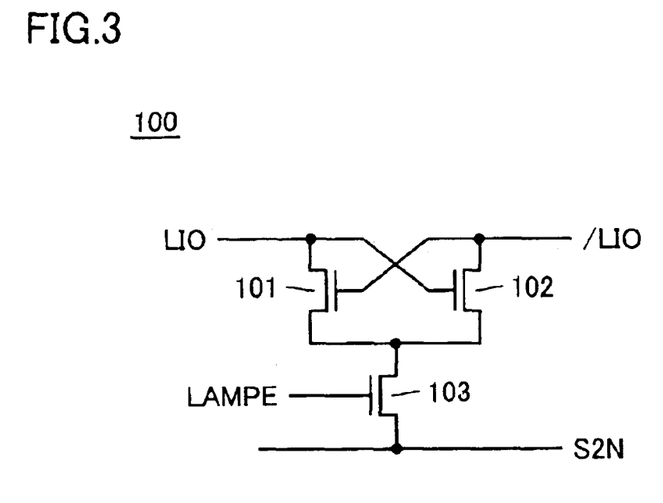
FIG. 3 is a circuit diagram showing a specific circuit configuration of a sub-amplifier 100 in the first embodiment.

FIG. 3 is a circuit diagram showing a specific circuit configuration of sub-amplifier 100 in the first embodiment.

Sub-amplifier 100 in the first embodiment shown in FIG. 3 includes N-channel MOS transistors 101, 102 cross-coupled to each other, and an N-channel MOS transistor 103 having control signal LAMPE input to the gate. Control signal LAMPE attains H level for a certain period after a read or write command is received.

N-channel MOS transistor 101 has the drain and the gate connected to the LIO line and the /LIO line respectively, while N-channel MOS transistor 102 has the drain and the gate connected to the /LIO line and the LIO line respectively. In addition, N-channel MOS transistors 101, 102 have the sources connected to the drain of N-channel MOS transistor 103, and N-channel MOS transistor 103 has the source connected to sense amplifier driving line S2N.

As described above, sense amplifier driving line S2N attains ground potential GND when the row block adjacent to one of sense amplifier zones 3 is activated, while it attains precharge potential VBL when that row block is inactivated. In other words, when the source of N-channel MOS transistor 103 is connected to sense amplifier driving line S2N, information of activation/inactivation in a row block and in one sense amplifier zone of adjacent sense amplifier zones 3 can be reflected in sub-amplifier 100.

With such a connection, when the row block adjacent to one of sense amplifier zones 3 is inactive, sub-amplifier 100 does not operate, even if control signal LAMPE attains H level. This is because sense amplifier driving line S2N and the LIO line pair both attain precharge potential VBL, and a gate-source voltage Vgs of N-channel MOS transistors 101, 102 attains 0V.

In other words, when the source of N-channel MOS transistor 103 is connected to sense amplifier driving line S2N, sub-amplifier 100 can be operated only when the row block adjacent to one of sense amplifier zones 3 is activated, without adding a circuit configuration for supplying a signal notifying of activation of the row block.

An effect described above can be achieved without adding a new transistor. In addition, as sense amplifier driving line S2N is originally present in sense amplifier zone 3, a new interconnection for obtaining the above-mentioned effect is not required. Therefore, sub-amplifier 100 with smaller area can be implemented.

A specific procedure for generating control signal LAMPE controlling an activation timing of sub-amplifier 100 will now be described.

Figure 4:
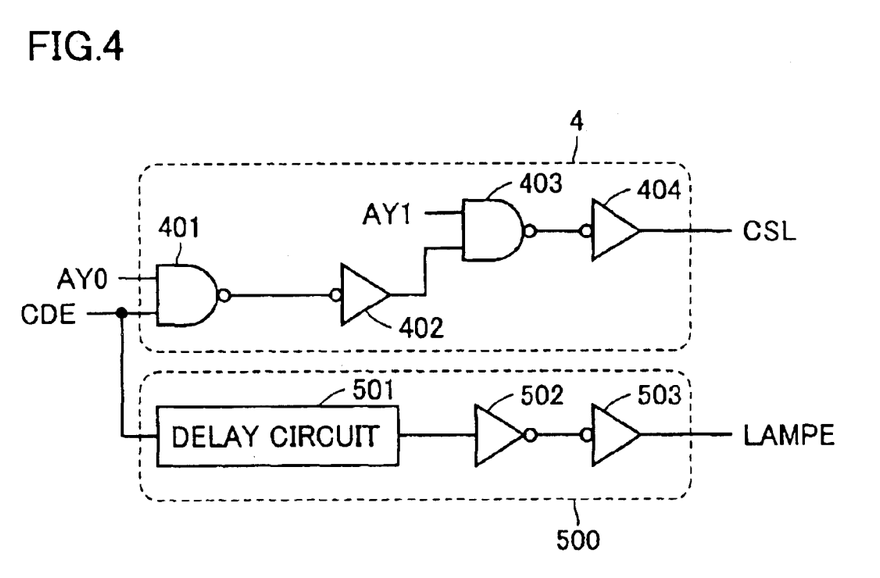
FIG. 4 is a circuit diagram showing a specific circuit configuration for generating a control signal LAMPE.

FIG. 4 is a circuit diagram showing a specific circuit configuration of column decoder 4 and a control signal generating circuit 500 generating control signal LAMPE.

As shown in FIG. 4, column decoder 4 includes NAND gates 401, 403 and inverters 402, 404. Control signal generating circuit 500 includes a delay circuit 501 and inverters 502, 503. Control signal generating circuit 500 forms a portion in a circuit configuration in read/write control circuit 5 in FIG. 1.

NAND gate 401 has column selection enable signal CDE and a predecode signal AY0 input, and has an output connected to an input of inverter 402. NAND gate 403 has an output from inverter 402 and a predecode signal AY1 input, and has an output connected to an input of inverter 404. An output of inverter 404 is connected to column selection line CSL.

On the other hand, column selection enable signal CDE is also input to delay circuit 501, which has an output provided to inverter 502. Inverter 503 has an output from inverter 502 input, and has control signal LAMPE controlling the activation timing of sub-amplifier 100 output.

Figure 5:
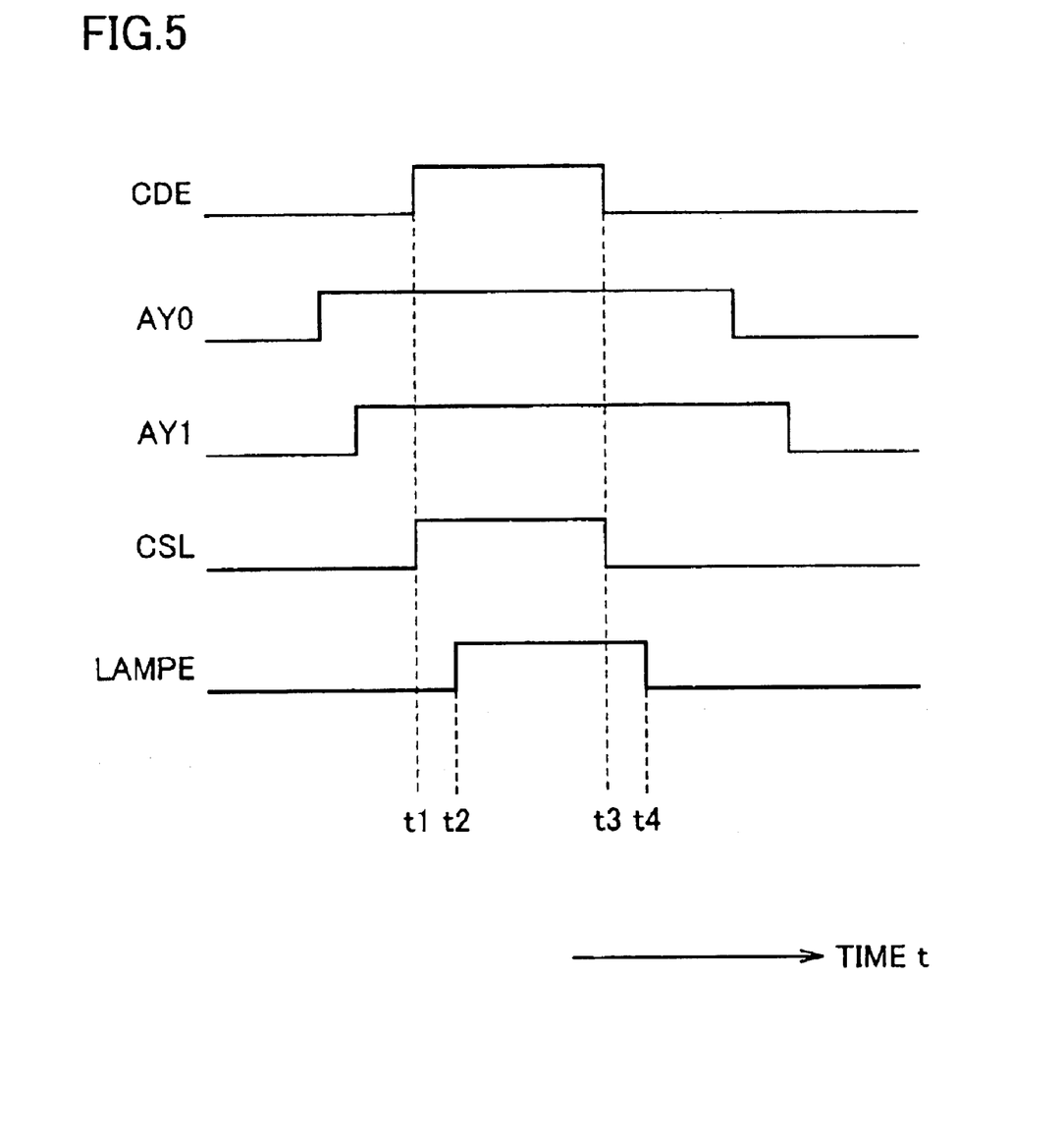
FIG. 5 is a timing chart illustrating generation of control signal LAMPE.

FIG. 5 is a timing chart illustrating generation of control signal LAMPE.

As shown in FIG. 5, predecode signals AY0, AY1 are ascertained at a timing including a period during which column selection enable signal CDE is at H level. An activation/inactivation timing of column selection line CSL is determined in synchronization with a rise at time t1 and a fall at time t3 of column selection enable signal CDE, respectively.

When column selection line CSL is activated in reading data, a data signal amplified by sense amplifier 10 is read on the LIO line pair. Thus, a potential difference between the LIO line pair becomes larger than sensitivity and offset of sub-amplifier 100. A time period required for activating sub-amplifier 100 is constant, so long as a reference voltage and an ambient temperature are stable.

Considering the required time period as described above, as shown in FIG. 5, with regard to the activation timing of control signal LAMPE, the control signal rises at time t2 delayed by a certain time from the activation timing of column selection enable signal CDE, and falls at time t4.

The specific generation procedure of control signal LAMPE described above is for data read. On the other hand, when the activation timing of control signal LAMPE in data write, which is different from that in data read, should be set, a mechanism switching a delay amount of delay circuit 501 in FIG. 4 in accordance with read/write should be added.

As described above, according to the first embodiment, sense amplifier driving line S2N is connected to the source of N-channel MOS transistor 103 in sub-amplifier 100. Accordingly, a semiconductor memory device with smaller area according to the present invention can be implemented, and the amplitude of the data read through the hierarchical input/output line to read/write control circuit 5 can be prevented from being lowered.

(Second Embodiment)

Sub-amplifier 100 in the first embodiment has been configured and arranged so as to amplify the small potential difference between the LIO line pair.

On the other hand, if an interconnection resistance/capacitance in the GIO line pair is dominant in parasitic resistance/capacitance of the entire hierarchical input/output line within the memory cell array, for example in reading, a sufficient potential difference in the LIO line pair by the data read from sense amplifier 10 will be produced even in the short period of time. However, a considerable time is necessary from a time point when the data is transmitted until a time point when the sufficient potential difference is produced in the GIO line pair. In this case, an effect of preventing lower amplitude of the data read through the hierarchical input/output line to read/write control circuit 5 will be less significant.

In addition, as sub-amplifier 100 is activated solely during read operation, how much potential difference can be achieved in a short period of time is important. Therefore, considering a voltage drop due to on-resistance by N-channel MOS transistors 61, 62 in input/output switching circuit 60, it is disadvantageous to amplify the potential difference between the LIO line pair, as in sub-amplifier 100. A circuit configuration of crossing zone 6 and the periphery thereof in order to solve the above-mentioned problems will be described in the second embodiment.

Figure 6:
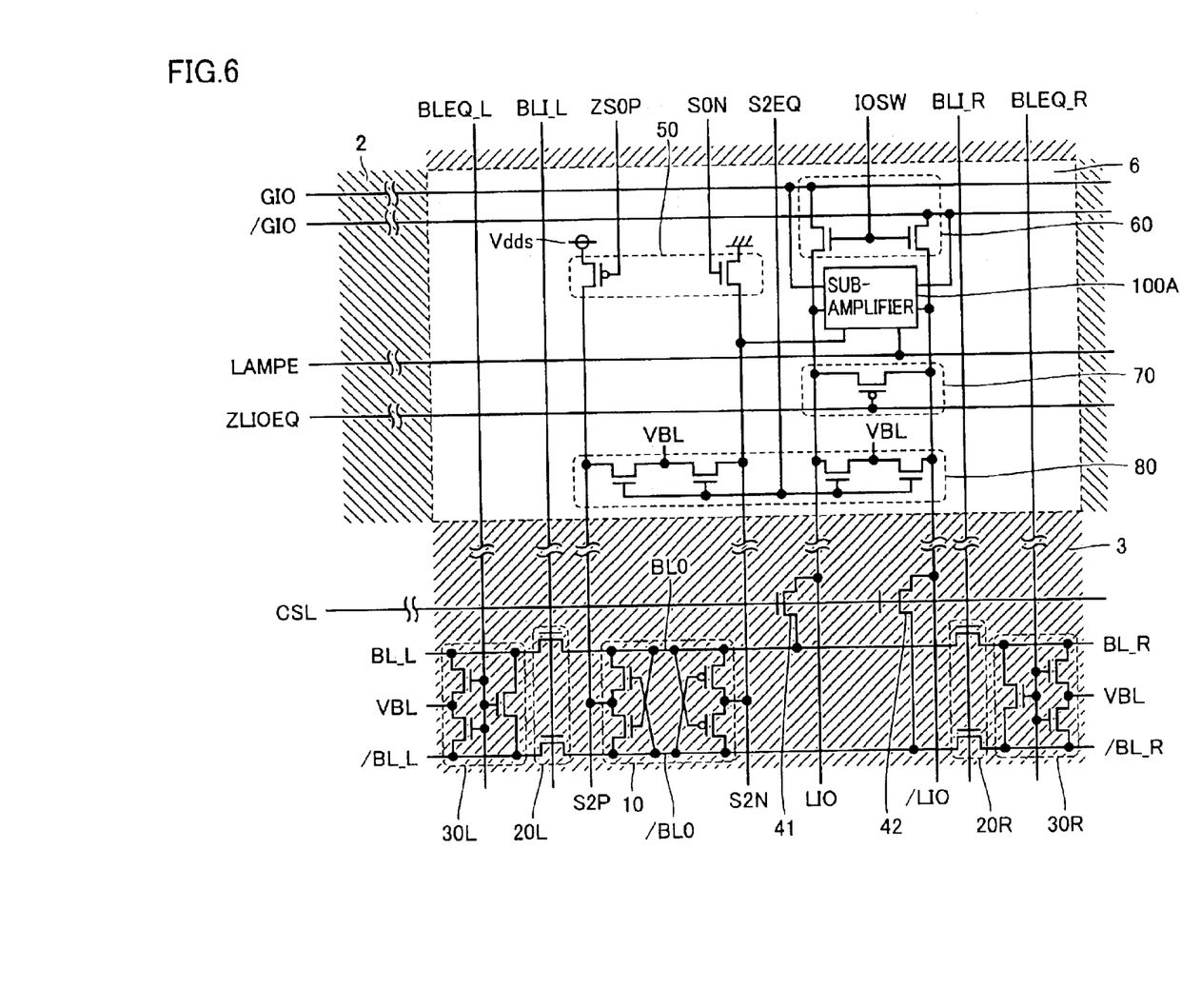
FIG. 6 is a circuit diagram showing a circuit configuration of crossing zone 6 and a periphery thereof in a second embodiment.

FIG. 6 is a circuit diagram showing a circuit configuration of crossing zone 6 and the periphery thereof in the second embodiment.

The circuit configuration of crossing zone 6 and the periphery thereof in the second embodiment shown in FIG. 6 is different from that in the first embodiment shown in FIG. 2 in that sub-amplifier 100 is replaced with a sub-amplifier 100A having a different configuration and arrangement. A specific circuit configuration of sub-amplifier 100A will now be described.

Figure 7:
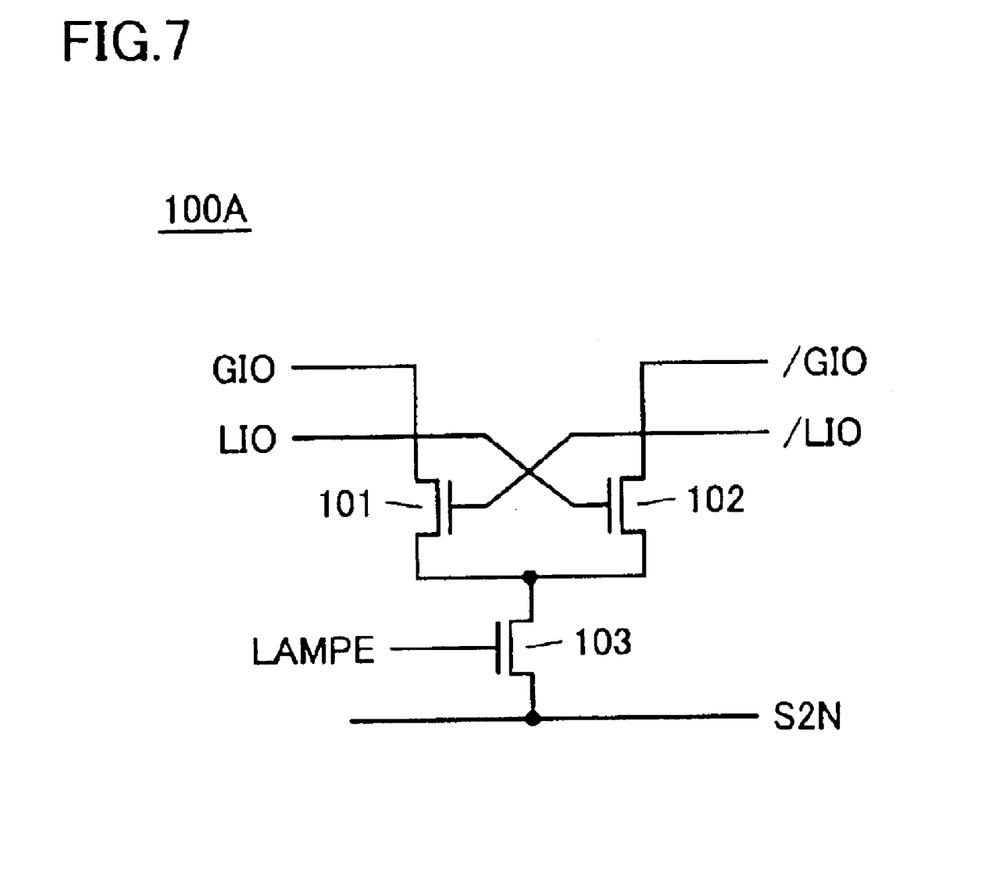
FIG. 7 is a circuit diagram showing a specific circuit configuration of a sub-amplifier 100A in the second embodiment.

FIG. 7 is a circuit diagram showing a specific circuit configuration of sub-amplifier 100A in the second embodiment.

Sub-amplifier 100A in the second embodiment shown in FIG. 7 is different from sub-amplifier 100 in the first embodiment in that the GIO line and the /GIO lines instead of the LIO line and the /LIO line are connected to the drains of N-channel MOS transistors 101, 102, respectively.

When the LIO line pair in which relatively large potential difference can be achieved is connected to the gates of N-channel MOS transistors 101, 102, sufficient conductance difference between N-channel MOS transistors 101, 102 can be attained. Sub-amplifier 100A can directly reflect the conductance difference to an amount of charges pulled from the GIO line pair, and influence of the on-resistance by N-channel MOS transistors 61, 62 in input/output switching circuit 60 can be avoided.

As described above, according to the second embodiment, the GIO line and the /GIO line are connected to the drains of N-channel MOS transistors 101, 102 of sub-amplifier 100A, respectively. Accordingly, a semiconductor memory device with smaller area according to the present invention can be implemented, and the amplitude of the data read through the hierarchical input/output line to read/write control circuit 5 can more effectively be prevented from being lowered.

(Third Embodiment)

Figure 8:
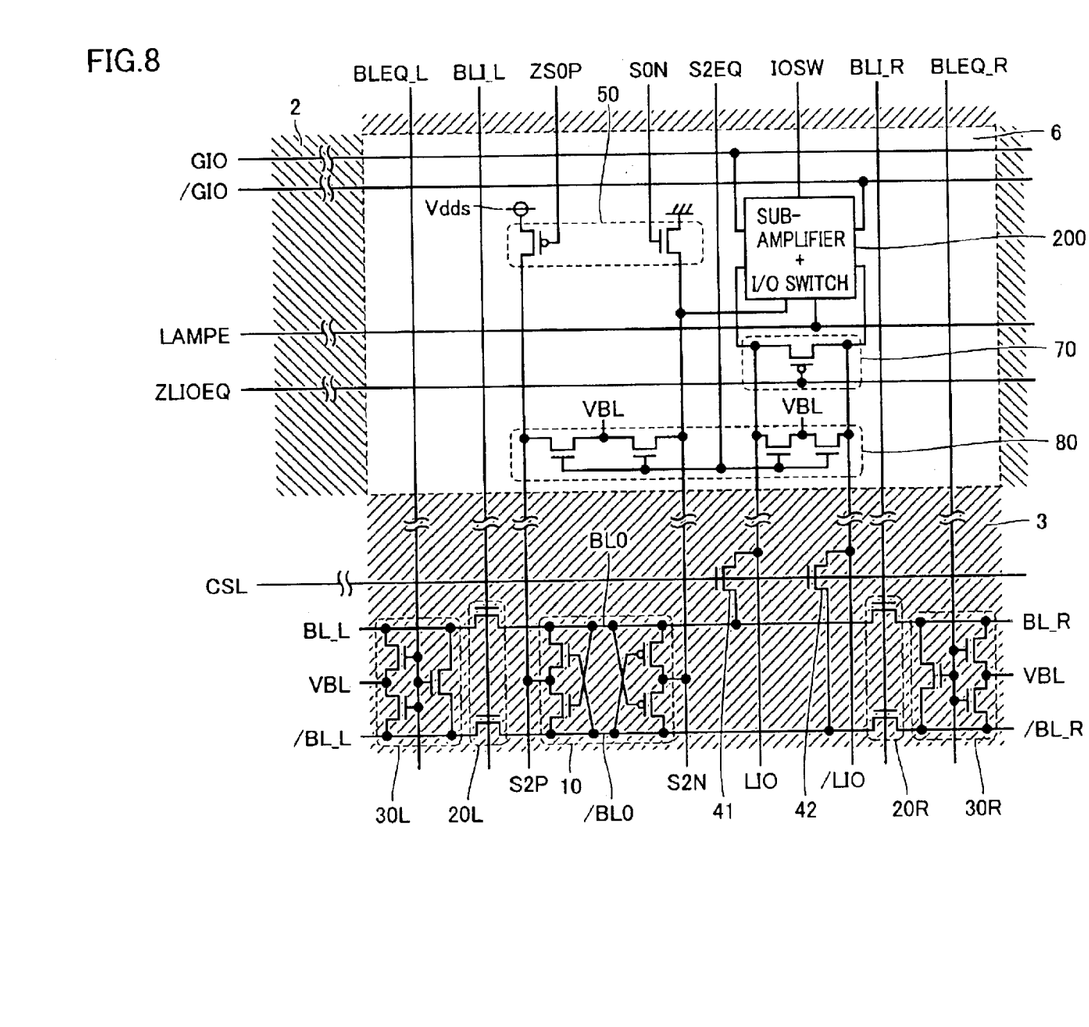
FIG. 8 is a circuit diagram showing a circuit configuration of crossing zone 6 and a periphery thereof in a third embodiment.

FIG. 8 is a circuit diagram showing a circuit configuration of crossing zone 6 and the periphery thereof in a third embodiment.

The circuit configuration of crossing zone 6 and the periphery thereof in the third embodiment shown in FIG. 8 is different from that in the second embodiment shown in FIG. 6 in that sub-amplifier 100A and input/output switching circuit 60 are replaced with a sub-amplifier+input/output switching circuit 200 incorporating functions of both components in the second embodiment. A specific circuit configuration of sub-amplifier+input/output switching circuit 200 will now be described.

Figure 9:
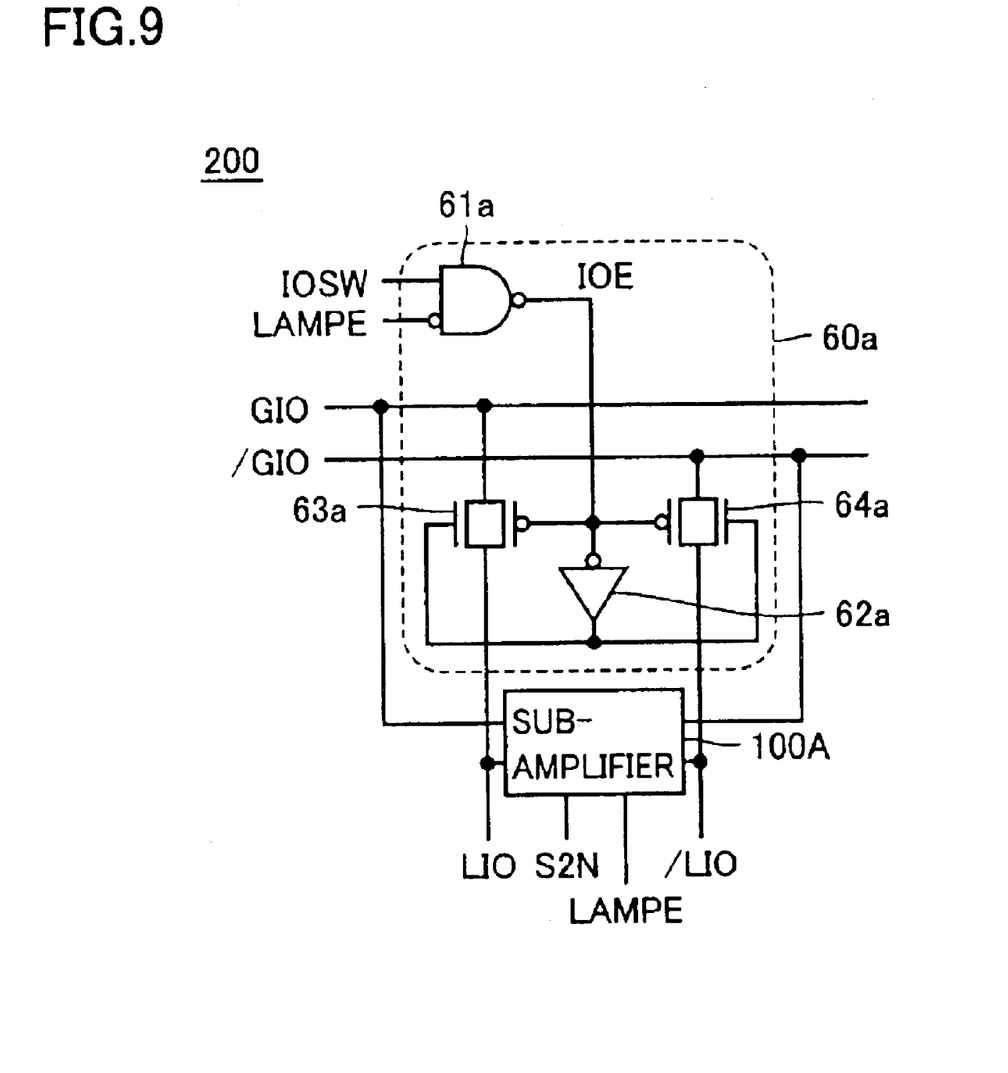
FIG. 9 is a circuit diagram showing a specific circuit configuration of a sub-amplifier+input/output switching circuit 200 in the third embodiment.

FIG. 9 is a circuit diagram showing a specific circuit configuration of sub-amplifier+input/output switching circuit 200 in the third embodiment.

Sub-amplifier+input/output switching circuit 200 in the third embodiment shown in FIG. 9 includes sub-amplifier 100A identical to that in the second embodiment and an input/output switching circuit 60a. Input/output switching circuit 60a includes an NAND gate 61a, an inverter 62a, and transfer gates 63a, 64a.

NAND gate 61a has input/output switching signal IOSW and control signal LAMPE input, and an output signal IOE input to inverter 62a. An input/output of inverter 62a is input to transfer gates 63a, 64a. Here, in the third embodiment, control signal LAMPE is assumed to attain H level only when the read command is received.

Figure 10:
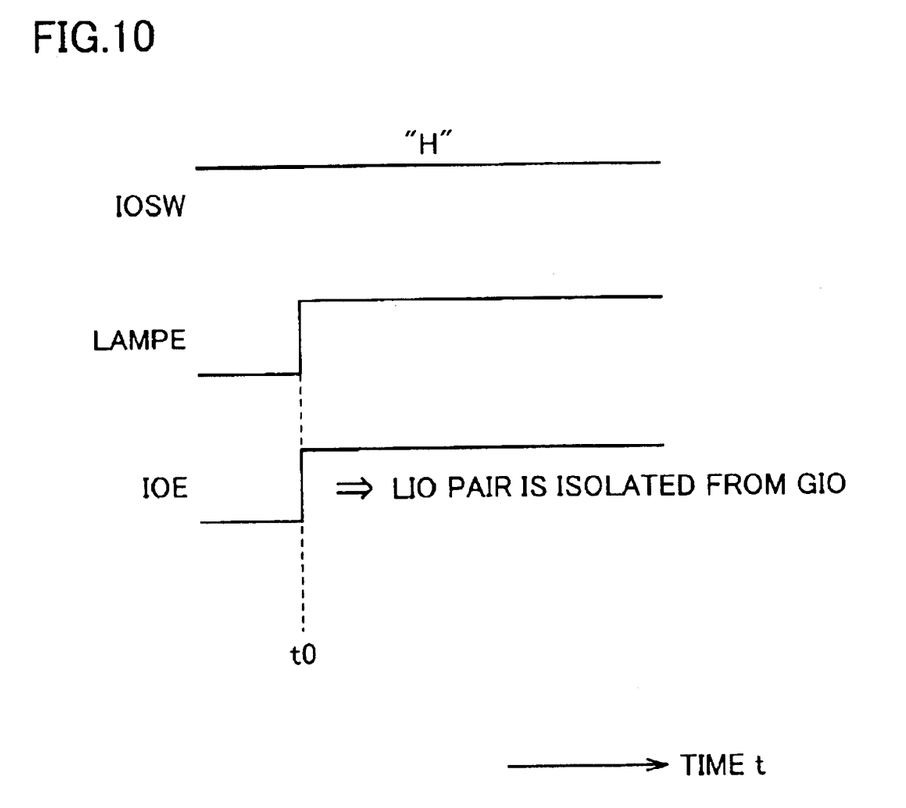
FIG. 10 is a timing chart illustrating an operation of an input/output switching circuit 60a in sub-amplifier+input/output switching circuit 200.

FIG. 10 is a timing chart illustrating an operation of input/output switching circuit 60a in sub-amplifier+input/output switching circuit 200.

As shown in FIG. 10, when input/output switching signal IOSW attains H level and when control signal LAMPE attains H level at time t0, output signal IOE of NAND gate 61a attains H level. Output signal IOE is input to transfer gates 63a, 64a as it is, and a signal that has attained L level via inverter 62a is also input to transfer gates 63a, 64a. The LIO line pair is electrically isolated from the GIO line pair.

Consequently, since load by the hierarchical input/output line from sense amplifier 10 is imposed only on the LIO line pair, the potential difference between the LIO line pair will be considerably large. Therefore, a drivability ratio of N-channel MOS transistors 101 and 102 in sub-amplifier 100A will be significantly large, resulting in a large potential difference between the GIO line pair.

As control signal LAMPE is at L level in data writing, output signal IOE of NAND gate 61a attains L level, and the LIO line pair is electrically connected to the GIO line pair. Consequently, the data transmitted via the GIO line pair from read/write control circuit 5 is sent to sense amplifier 10, and data write is carried out.

In input/output switching circuit 60a, though electrical connection/isolation between the LIO line pair and the GIO line pair has been controlled by control signal LAMPE in addition to input/output switching signal IOSW, a control signal CDED with a timing earlier than control signal LAMPE may replace control signal LAMPE.

Figure 11:
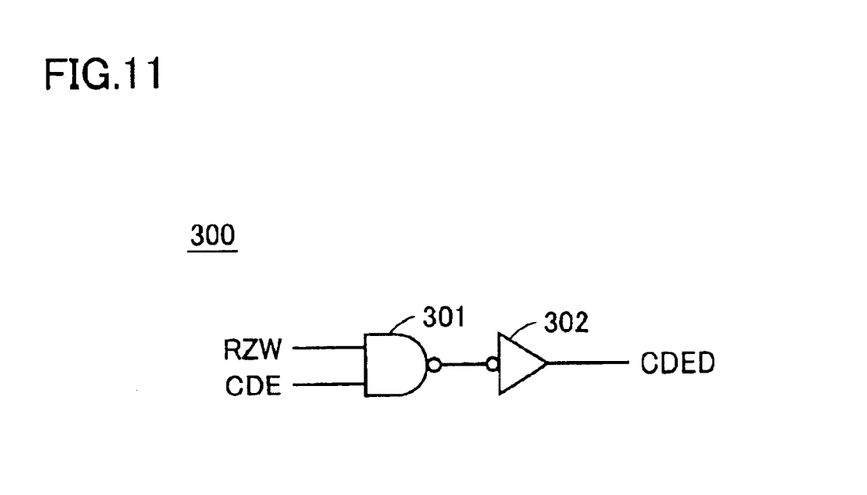
FIG. 11 is a circuit diagram showing a circuit configuration of a control signal generating circuit 300 generating a control signal CDED.

FIG. 11 is a circuit diagram showing a circuit configuration of a control signal generating circuit 300 generating a control signal CDED.

As shown in FIG. 11, control signal generating circuit 300 includes an NAND gate 301 and an inverter 302. NAND gate 301 has a signal RZW and column selection enable signal CDE input, and has an output connected to an input of inverter 302. An output of inverter 302 serves as control signal CDED. Here, signal RZW attains H level only during reading, while it attains L level during writing as well as when a component in column direction is inactive.

With a configuration above, control signal CDED is delayed by only two stages from column selection enable signal CDE determining the activation timing of column selection line CSL. Therefore, by using control signal CDED instead of control signal LAMPE, the LIO line pair is substantially isolated electrically from the GIO line pair, at a time point when bit line pair BL0, /BL0 is electrically connected to the LIO line pair.

Therefore, the potential difference between the LIO line pair will increase before control signal LAMPE attains H level, and the potential difference between the GIO line pair will increase faster than in an example where control signal LAMPE is used.

As described above, according to the third embodiment, functions of sub-amplifier 100A and input/output switching circuit 60 are combined, and control signal LAMPE that attains H level upon receiving the read command is used. Accordingly, a semiconductor memory device with smaller area according to the present invention can be implemented, and the amplitude of the data read through the hierarchical input/output line to read/write control circuit 5 can more effectively be prevented from being lowered.

In addition, by using control signal CDED instead of control signal LAMPE, with a timing closer to column selection enable signal CDE, the potential difference between the GIO line pair can be increased faster than in the example where control signal LAMPE is used.

Here, in the embodiments as described above, though an example in which the data is read through the hierarchical input/output line having a common input/output has been described, this is only by way of illustration. The semiconductor memory device according to the present invention is also applicable to an example in which the data is read from an output side of the input/output line (a data line) where an input and an output is separate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells arranged in a matrix of rows and columns;
   a plurality of word lines arranged corresponding to a plurality of rows in said plurality of memory cells;
   a plurality of bit line pairs arranged corresponding to a plurality of columns in said plurality of memory cells;
   a plurality of sense amplifier zones detecting and amplifying data read from said plurality of memory cells; and
   a plurality of sub-word line driver zones intersecting each of said plurality of sense amplifier zones; wherein
   each of said plurality of sense amplifier zones includes
   a plurality of sense amplifiers provided corresponding to said plurality of bit line pairs and detecting and amplifying a potential difference between the corresponding bit line pair,
   a sense amplifier driving line provided in common to said plurality of sense amplifiers, and
   a plurality of first data line pairs provided corresponding to said plurality of bit line pairs and each selectively connected to a corresponding bit line;
   the semiconductor memory device further comprises a plurality of sub-amplifiers provided corresponding to each of said plurality of first data line pairs;
   each of said plurality of sub-amplifiers includes first, second, and third transistors;
   said first transistor has a control terminal connected to one line of said first data line pair, a first conductive terminal connected to another line of said first data line pair, and a second conductive terminal connected to a first conductive terminal of said third transistor;
   said second transistor has a control terminal connected to another line of said first data line pair, a first conductive terminal connected to one line of said first data line pair, and a second conductive terminal connected to the first conductive terminal of said third transistor; and
   said third transistor has a control terminal receiving an activation timing control signal for said sub-amplifier, and a second conductive terminal connected to said sense amplifier driving line.

2. A semiconductor memory device, comprising:
   a plurality of memory cells arranged in a matrix of rows and columns;
   a plurality of word lines arranged corresponding to a plurality of rows in said plurality of memory cells;
   a plurality of bit line pairs arranged corresponding to a plurality of columns in said plurality of memory cells;
   a plurality of sense amplifier zones detecting and amplifying data read from said plurality of memory cells; and
   a plurality of sub-word line driver zones intersecting each of said plurality of sense amplifier zones; wherein
   each of said plurality of sense amplifier zones includes
   a plurality of sense amplifiers provided corresponding to said plurality of bit line pairs and detecting and amplifying a potential difference between the corresponding bit line pair,
   a sense amplifier driving line provided in common to said plurality of sense amplifiers, and a plurality of first data line pairs provided corresponding to said plurality of bit line pairs and each selectively connected to a corresponding bit line;

each of said plurality of sub-word line driver zones includes a plurality of second data line pairs provided corresponding to said plurality of first data line pairs and receiving data amplified via said sub-amplifier of corresponding said first data line pair in reading;

the semiconductor memory device further comprises a plurality of sub-amplifiers provided corresponding to each of said plurality of first data line pairs;

each of said plurality of sub-amplifiers includes first, second, and third transistors;

said first transistor has a control terminal connected to one line of said first data line pair, a first conductive terminal connected to one line of said second data line pair, and a second conductive terminal connected to a first conductive terminal of said third transistor;

said second transistor has a control terminal connected to another line of said first data line pair, a first conductive terminal connected to another line of said second data line pair, and a second conductive terminal connected to the first conductive terminal of said third transistor; and said third transistor has a control terminal receiving an activation timing control signal for said sub-amplifier, and a second conductive terminal connected to said sense amplifier driving line.

3. The semiconductor memory device according to claim 1, further comprising a column decoder generating a column selection signal selecting said bit line pair connected to each of said plurality of first data line pairs in response to an address signal, and a control signal generating circuit outputting an activation timing control signal for said sub-amplifier, upon receiving a column selection enable signal activating said column decoder, wherein said control signal generating circuit includes a delay circuit delaying activation of said activation timing control signal for said sub-amplifier until a time point after said column selection signal is activated.

4. The semiconductor memory device according to claim 2, wherein a column decoder generating a column selection signal selecting said bit line pair connected to each of said plurality of first data line pairs in response to an address signal, and a control signal generating circuit outputting an activation timing control signal for said sub-amplifier, upon receiving a column selection enable signal activating said column decoder, wherein said control signal generating circuit includes a delay circuit delaying activation of said activation timing control signal for said sub-amplifier until a time point after said column selection signal is activated.

5. The semiconductor memory device according to claim 2, wherein said sub-amplifier further includes an input/output switching circuit controlling connection/isolation between said first data line pair and said second data line pair, and said input/output switching circuit includes an NAND circuit having an inverted signal of said activation timing control signal for said sub-amplifier and an input/output switching signal input, an inverter inverting an output from said NAND circuit, and first and second transfer gate circuits connecting/isolating said first data line pair to/from said second data line pair, in response to an input/output of said inverter.

6. The semiconductor memory device according to claim 1, wherein each of said plurality of sub-amplifiers is provided in a region where said plurality of sense amplifier zones cross said plurality of sub-word line driver zones.

7. The semiconductor memory device according to claim 2, wherein each of said plurality of sub-amplifiers is provided in a region where said plurality of sense amplifier zones cross said plurality of sub-word line driver zones.

* * * * *